(12) United States Patent
Newman et al.

(10) Patent No.: US 8,317,449 B2
(45) Date of Patent: Nov. 27, 2012

(54) MULTIPLE SUBSTRATE TRANSFER ROBOT

(75) Inventors: Jacob Newman, Palo Alto, CA (US); Dinesh Kanawade, Sunnyvale, CA (US); Nir Merry, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 522 days.

(21) Appl. No.: 12/049,051

(22) Filed: Mar. 14, 2008

(65) Prior Publication Data

US 2008/0219824 A1    Sep. 11, 2008

Related U.S. Application Data

(63) Continuation-in-part of application No. 11/682,296, filed on Mar. 5, 2007, now abandoned.

(51) Int. Cl.
*H01L 21/677* (2006.01)
(52) U.S. Cl. .................. 414/217; 414/411; 414/806
(58) Field of Classification Search .................. 414/217, 414/411, 806
See application file for complete search history.

(56) References Cited

U.S. PATENT DOCUMENTS

| | | | |
|---|---|---|---|
| 5,564,889 A * | 10/1996 | Araki | 414/806 |
| 5,989,346 A * | 11/1999 | Hiroki | 118/719 |
| 6,293,749 B1 * | 9/2001 | Raaijmakers et al. | 414/609 |
| 6,352,593 B1 | 3/2002 | Brors et al. | |
| 6,455,814 B1 | 9/2002 | Samoilov et al. | |
| 6,722,834 B1 * | 4/2004 | Tepman | 414/217 |
| 6,811,040 B2 | 11/2004 | Payne et al. | |
| 7,022,192 B2 * | 4/2006 | Dip et al. | 118/725 |
| 7,022,948 B2 | 4/2006 | Shang et al. | |
| 7,153,088 B2 * | 12/2006 | Reimer et al. | 414/783 |
| 2003/0017044 A1 * | 1/2003 | Cameron et al. | 414/811 |
| 2003/0049372 A1 | 3/2003 | Cook et al. | |
| 2004/0175893 A1 | 9/2004 | Vatus et al. | |
| 2005/0188923 A1 | 9/2005 | Cook et al. | |

* cited by examiner

*Primary Examiner* — Scott Lowe
(74) *Attorney, Agent, or Firm* — Moser Taboada; Alan Taboada

(57) ABSTRACT

Embodiments of multiple substrate transfer robots and substrate processing systems have been disclosed herein. In some embodiments, a multiple substrate transfer robot is provided and may include an arm capable of extending along a horizontal direction; and a wrist coupled to the arm and having a plurality of blades coupled thereto, each blade configured to horizontally support a substrate thereupon and vertically disposed with respect to each of the other blades. In some embodiments, a substrate processing system is provided and may include a substrate processing chamber having a plurality of susceptors, wherein each susceptor is vertically disposed and capable of holding a semiconductor substrate; and a substrate transfer robot having a plurality of blades for transferring a plurality of substrates to and from the processing chamber, each blade configured to horizontally support a substrate thereupon and vertically disposed with respect to each of the other blades.

11 Claims, 14 Drawing Sheets

MULTIPLE SUBSTRATE TRANSFER ROBOT

CROSS-REFERENCE TO RELATED APPLICATIONS

This application is a continuation-in-part of co-pending U.S. patent application Ser. No. 11/682,296, filed, Mar. 5, 2007, and entitled, "MICROBATCH DEPOSITION CHAMBER WITH RADIANT HEATING", which is herein incorporated by reference in its entirety.

BACKGROUND OF THE INVENTION

1. Field of the Invention

Embodiments of the present invention generally relate to semiconductor processing apparatus. In particular, embodiments of the invention relate to a multi-substrate transfer robot and semiconductor processing system for high throughput processing of semiconductor wafers.

2. Description of the Related Art

The growth of silicon-containing epitaxial films has become increasingly important due to new applications for advanced semiconductor devices. Such films may be grown selectively or non-selectively (blanket deposition) on the substrate. By selective growth it is generally meant that an epitaxial film is grown at specific locations on a substrate having device feature patterns already incorporated therein. For example, the substrate may include patterns for gate electrodes, spacers, ultra-shallow junctions, or other features. To avoid damaging such device features during fabrication, it may be desirable to use lower temperature processes during epitaxial film growth.

The desire for lower process temperatures has led to the development of the low or reduced pressure chemical vapor deposition (LPCVD or RPCVD; herein after to be referred to as LPCVD) epitaxial reactor. Deposition at lower pressures allows lower temperatures to be used while improving film uniformity. In one example of LPCVD epitaxial silicon deposition, the reactor deposition temperature may range from about 600 degrees Celsius to about 1100 degrees Celsius, and the deposition pressure may range from about 10 Torr to 100 Torr. However, lower process temperatures can slow chemical reaction rates which can adversely affect film properties.

In epitaxial films, lack of uniformity can lead to poor device performance. Gas flow dynamics help determine the thickness uniformity. Certain epitaxial processes may take place at lower temperatures so that reaction kinetics control the deposition rate. In this case, temperature more strongly influences both thickness and resistivity uniformity. However, gas flow will still affect thickness.

The desire for better control of gas flow dynamics and substrate temperature has led to the development of the single substrate LPCVD epitaxial reactor chamber which uses radiant heating. Batch processing of many substrates creates variation in temperature and gas flow across each substrate within the batch, and from batch to batch. The use of radiant heating in the single substrate reactor allows a more uniform temperature profile across the substrate surface, and the gas flow dynamics can be more precisely controlled for a single substrate so that the distribution of reactant material over the substrate is more uniform.

Unfortunately, a single substrate processing reactor cannot match the throughput of a batch (over 50 substrates), mini-batch (about 25-50 substrates), or micro-batch (less than 25 substrates) LPCVD epitaxial reactor. Additionally, the use of radiant heating during selective epitaxial deposition can lead to temperature variations across the substrate surface since the emissivity of a substrate is highly dependent on the thin film structures and materials on the substrate surface.

Therefore, there is a need for a low temperature epitaxial deposition reactor with increased throughput that can provide improved substrate temperature uniformity and more uniform process gas flow across the substrate surface.

Additionally, the exchange of substrates is critical for maintaining high throughput in such applications. Conventionally, such exchanges are performed by substrate transfer robots that may carry a single substrate at a time. Unfortunately, such single-substrate transfer limits the exchange rate of substrates.

Therefore, there is a need for substrate transfer robots capable of high throughput substrate exchanges.

SUMMARY OF THE INVENTION

Embodiments of multiple substrate transfer robots and substrate processing systems have been disclosed herein. In some embodiments, a multiple substrate transfer robot is provided and may include an arm capable of extending along a horizontal direction; and a wrist coupled to the arm and having a plurality of blades coupled thereto, each blade configured to horizontally support a substrate thereupon and vertically disposed with respect to each of the other blades.

In some embodiments, a substrate processing system is provided and may include a substrate processing chamber having a plurality of susceptors, wherein each susceptor is vertically disposed and capable of holding a semiconductor substrate; and a substrate transfer robot having a plurality of blades for transferring a plurality of substrates to and from the processing chamber, each blade configured to horizontally support a substrate thereupon and vertically disposed with respect to each of the other blades. The invention apparatus may advantageously reduce substrate loading and exchange between the multiple substrate transfer robot and the processing chamber.

In another aspect of the invention, a method for exchanging substrates is provided. In some embodiments, a method for exchanging substrates may include providing a processing chamber having a plurality of vertically disposed susceptors disposed therein; and extending an arm of a substrate transfer robot into the processing chamber, the arm having a wrist with a plurality of blades coupled thereto, wherein each blade is configured to horizontally support a substrate thereupon and is vertically disposed with respect to each of the other blades and, upon extension into the processing chamber, each blade of the plurality of blades interfaces with a respective one of the plurality of vertically disposed susceptors.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
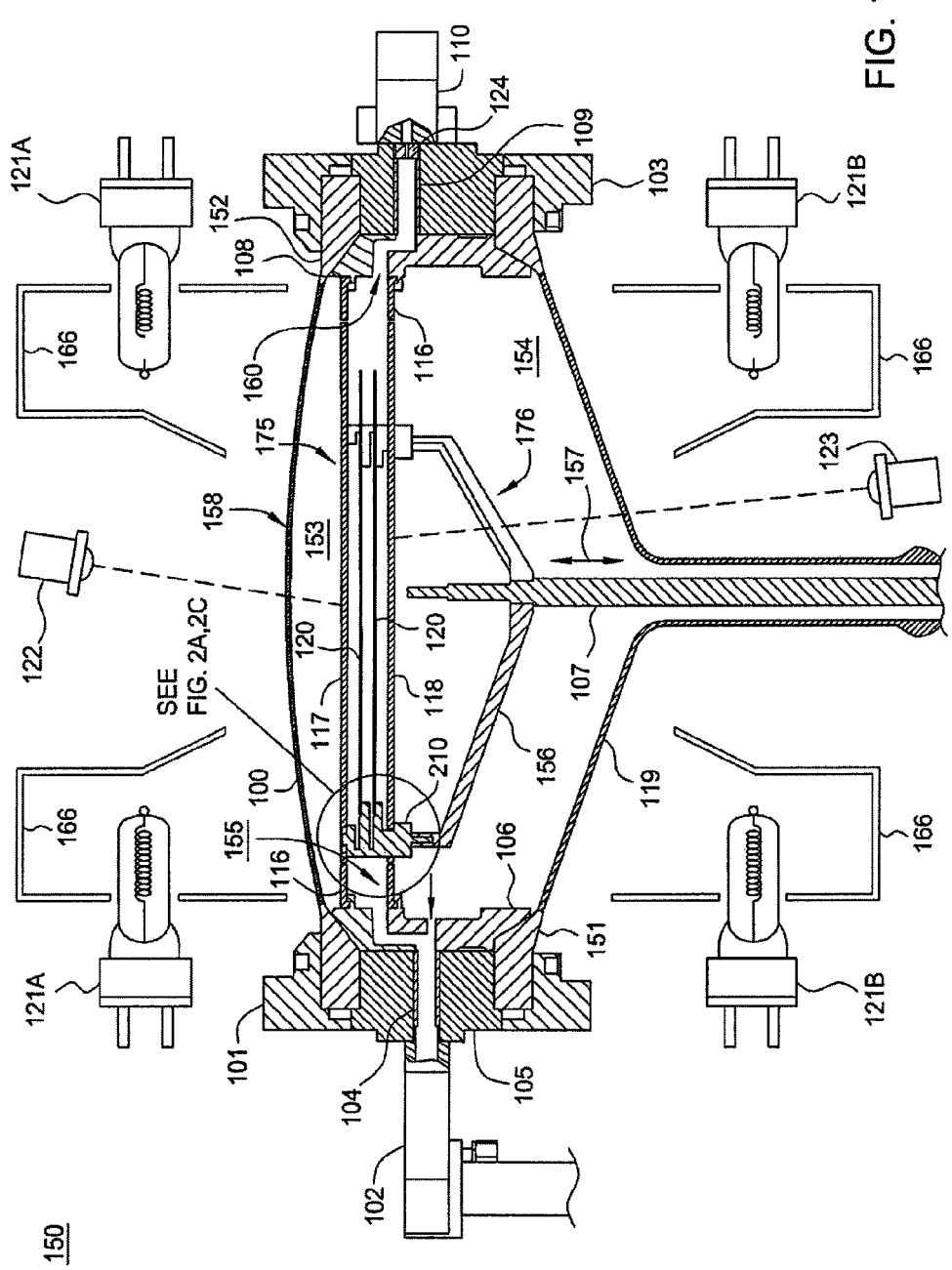
FIG. 1 is a schematic cross-sectional view of an epitaxial deposition reactor chamber according to one embodiment of the present invention.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides an apparatus and method for an epitaxial deposition chamber that has the capability of processing more than one substrate at a time while retaining the many favorable aspects of single substrate processing. Embodiments of the invention described herein are adapted to maximize uniformity of gas flow and temperature across the surfaces of the substrates and, hence, provide uniformity and repeatability of process results.

FIG. 1 is a schematic cross-sectional view of an epitaxial deposition reactor chamber 150 according to one embodiment of the present invention. The reactor chamber 150 includes a processing chamber 158 with an enclosed processing volume 175 and high-intensity upper lamps 121A and lower lamps 121B for radiant heating. In the present embodiment, the processing chamber is a cold wall, LPCVD chamber.

The processing chamber 158 includes an upper dome 100, a lower dome 119, and a base ring 105. The base ring 105 may be made of stainless steel, and the upper and lower domes 100, 119 may be made of a transparent material, such as high-purity quartz, to allow light to pass through for radiant heating of the substrate 120. Also, quartz exhibits a relatively high structural strength, and is chemically inert to the process environment of the deposition chamber. An upper liner 108 and a lower liner 106 are mounted against the inner sidewall of the base ring 105 to isolate the stainless steel of the base ring 105 from the processing volume 175 of the processing chamber 158 and prevent process contamination. The upper and lower liners 108, 106 may be made of opaque quart to protect the stainless steel of the base ring 105 from heat and process gases. The opaque quartz scatters light and inhibits the transfer of radiant heat from the radiant source to the stainless steel of the base ring 105.

An upper clamp ring 101 is used to clamp the upper dome 100 to the base ring 105, and a lower clamp ring 103 is used to clamp the lower dome 119 to the base ring 105. The upper and lower clamp rings 101, 103 may be made of stainless steel. Direct contact between the quartz and metal base ring and clamp rings is prevented using o-rings (not shown) and polymer barrier rings (not shown).

Inside the processing chamber 158 is disposed a susceptor lift assembly 176 which includes a flat, circular top susceptor 117, a flat, circular bottom susceptor 118, and carrier rods 210. Two substrates 120 may be disposed between the top and bottom susceptors 117 and 118. The top and bottom susceptors 117, 118 and substrates 120 are supported by three carrier rods 210 which are disposed at about 120 degrees apart (as can be seen in FIG. 7B which is a top view of the susceptor lift assembly 176 which includes carrier rods 210). In one embodiment of the present invention, the susceptor lift assembly 176 may include three or more carrier rods. In other embodiments, the carrier rods may be suitably modified to support one or more additional susceptors (not shown) between the top and bottom susceptors 117,118, and may also be adapted to support one or more substrates, with the substrates 120 located between susceptors, which may include a top and a bottom susceptor 117 and 118. In yet another embodiment, the carrier rods may be adapted to support a single substrate 120 between top and bottom susceptors 117, 118.

The susceptor lift assembly 176 also includes three arms 156 and a susceptor support shaft 107 with each arm connected to the support shaft. A carrier rod 210 is mounted to each of the arms, and the susceptor support shaft 107 extends perpendicularly downward from the center of the bottom susceptor 118. The susceptor support shaft 107 is connected to a motor (not shown) which can rotate the shaft and susceptor lift assembly 176. The susceptor lift assembly 176 is also capable of moving up or down as shown by arrows 157 to position the substrates for processing or to facilitate substrate loading and unloading.

Referring to FIG. 1, processing chamber 158 also includes two annular preheat rings 116 which are concentric to the top and bottom susceptors 117 and 118. The outer periphery of one preheat ring 116 is connected to the inside periphery of the upper liner 108, and the outer periphery of a second preheat ring 116 is connected to the inside periphery of the lower liner 106. FIG. 1 shows the susceptor lift assembly 176 in the process position, and in this position a top preheat ring 116 is coplanar with a top susceptor 117, and a bottom preheat ring 116 is coplanar with a bottom susceptor 118. This alignment divides the chamber processing volume 175 into three parts: an upper volume 153 above the top susceptor 117; a lower volume 154 below the bottom susceptor 118; and a middle volume 155 between the top and bottom susceptors 117 and 118. The middle volume 155 functions as a processing volume during substrate processing. In one embodiment of the present invention, two preheat rings 116 which are identical in design are used for both top and bottom preheat ring positions. In other embodiments, the processing chamber 158 may be adapted to include multiple preheat rings 116, each of which may vary in design, and each preheat ring 116 may be aligned with a corresponding susceptor.

The processing chamber 158 is adapted to provide a means of introducing process gas to the chamber so that the gas is uniformly distributed over the surface of the substrates. In the present example, the process gas is defined as the gas or gas mixture which acts to remove, treat, or deposit a film on a substrate, such as a silicon wafer, that is placed in processing chamber 158. The process gas may include a carrier gas such as hydrogen ($H_2$) or nitrogen ($N_2$) or some other inert gas. For epitaxial silicon deposition, precursor gases such as silane ($SiH_4$) or dichlorosilane ($SiH_2Cl_2$) may be included in the process gas. Dopant source gases such as diborane ($B_2H_6$) or phosphine ($PH_3$) may also be included. In the case of cleaning or etching, hydrogen chloride (HCl) may be included in the process gas. Additional embodiments of process gas components for the present invention are described in United States Patent Application Number 20060115934.

A plurality of high intensity upper lamps 121A and lower lamps 121 B are radially positioned above and below the processing chamber 158. In one embodiment, tungsten-halogen lamps are used, each lamp with a rating of about 2 kW. These lamps emit strongly in the infrared. The lamps direct their light through the upper and lower domes 100 and 119 onto the top and bottom susceptors 117 and 118 and preheat rings 116 to heat the top and bottom susceptors 117 and 118 and preheat rings 116. The substrates 120, which are between the top and bottom susceptors 117 and 118, are indirectly heated by infrared (IR) radiation which is emitted by the top and bottom susceptors 117, 118 due to their temperature. The susceptors may have a high emissivity and efficiently re-radiate the radiant energy received. In addition, the uniformity of the susceptor material and surface provides a fairly constant emissivity value over the surface of the susceptor which improves temperature uniformity of the susceptor during radiant heating. The close proximity of the top and bottom susceptors 117, 118 to the substrates, and larger diameters of the susceptors compared to substrate diameters, also create a volume between the susceptors which may approximate a black body cavity radiator since IR radiation emitted by the substrates 120 may be captured by the top and bottom susceptors 117, 118 and re-radiated onto the substrates 120. The advantage of this configuration is that the dependence of radiant heating on the emissivity of the substrates may be significantly reduced. Such reduced dependence on substrate emissivity for radiant heating may be desirable for epitaxial deposition, especially in the case of selective deposition in which the substrate emissivity changes across the substrate surface and with each new deposition layer. In one embodiment of the present invention, the distance between susceptor and closest substrate is in the range of about 5 mm to about 15 mm. Although this embodiment uses infrared lamps for substrate heating, other types of lamps may be used. In other embodiments, other heating methods such as radio frequency inductive or resistive heating may be used.

Referring to FIG. 1, a temperature sensor 123, such as a pyrometer, is mounted below the lower dome 119 and faces the bottom surface of the bottom susceptor 118. The temperature sensor 123 is used to monitor the temperature of the of the bottom susceptor 118 by receiving infrared radiation emitted by the susceptor when it is heated. This temperature information can then be used to adjust the power delivered to the lower lamps 121 B as required. A second temperature sensor 122, such as a pyrometer, is mounted above the upper dome 100 and faces the top surface of the top susceptor 117. The temperature sensor 122 is used to monitor the temperature of the top susceptor 117 by receiving infrared radiation emitted by the susceptor when it is heated. This temperature information can then be used to adjust the power delivered to the upper lamps 121A as required. In this example, the susceptor temperatures are used to indirectly measure the substrate temperatures. However, as mentioned previously, the uniformity of the susceptor material and surface provides a fairly constant emissivity value over the surface of the susceptor, and this helps create temperature uniformity across the susceptor surface. As a result, the temperature measurement of the susceptors using IR temperature sensors such as pyrometers becomes more accurate. In one embodiment, temperature sensors 122, 123 may be infrared, non-contact temperature sensors, such as pyrometers. In other embodiments, other types of temperature sensors may be used. In yet another embodiment, more than one temperature sensor may be disposed above the top susceptor 117, and below the bottom susceptor 118.

In the present embodiment, the reactor chamber 150 shown in FIG. 1 is also a "cold wall" reactor. The base ring 105, and upper and lower liners 108 and 106 are at significantly lower temperature than the preheat rings 116, top and bottom susceptors 117 and 118, and the substrates 120 during processing. For example, when epitaxial deposition occurs, the susceptors and substrates may be heated to a temperature of about 800 degrees Celsius to about 900 degrees Celsius, while the base ring and upper and lower liners are at a temperature of about 400° C. to 600° C. The base ring 105 is water cooled, and the upper dome flange 152, lower dome flange 151, and upper and lower liners 108 and 106 are constructed of opaque quartz to inhibit transmission of IR radiation to the metal base ring 105. In addition, the upper and lower liners 108 and 106 do not receive direct radiation from the upper and lower lamps 121A, 121B due to reflectors 166.

Figure 2A:
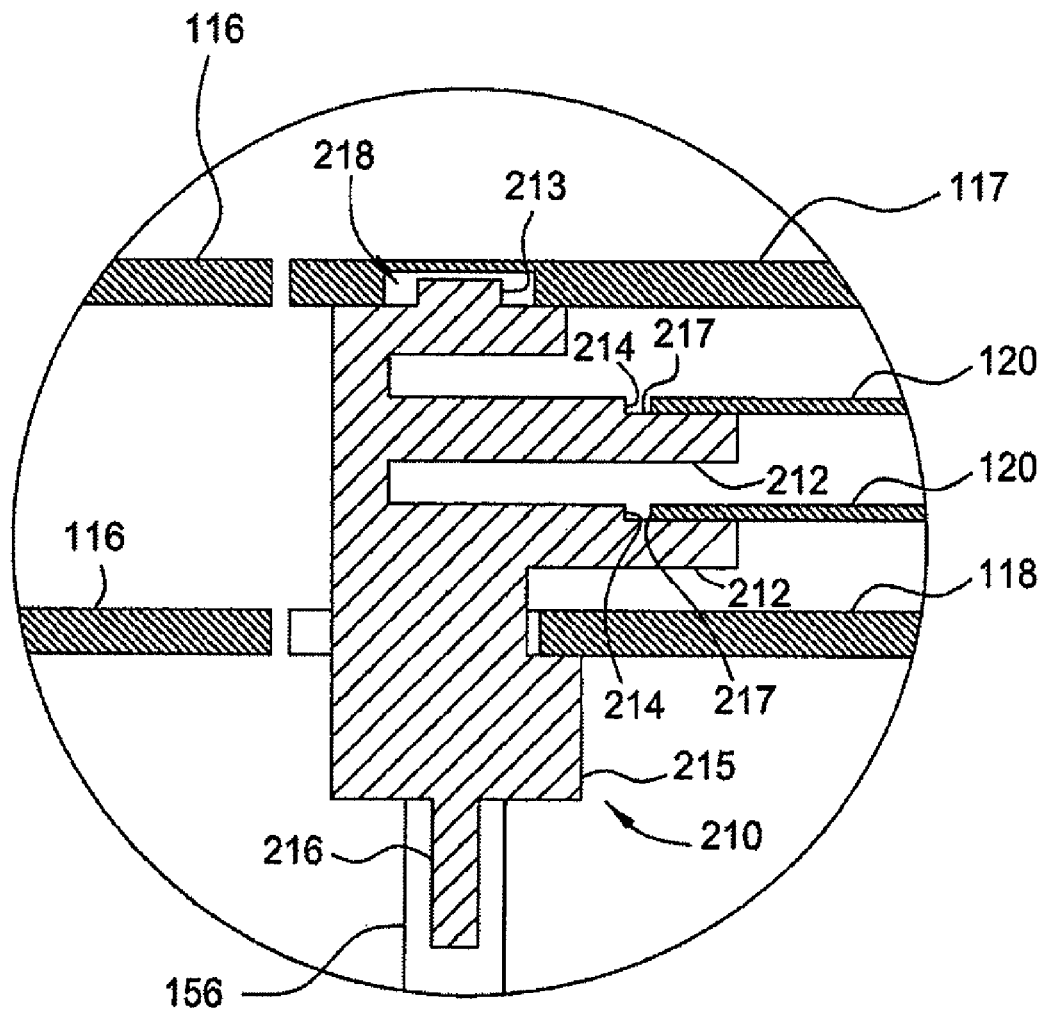
FIG. 2A is a detail view of one embodiment of a carrier rod shown in FIG. 1, according to the present invention.

FIG. 2A is a detail view of one embodiment of a carrier rod shown in FIG. 1, according to the present invention. The carrier rod 210 includes a rod with a first end and a second end, with a boss 213 at the first end, and a base 215 at the second end. The base 215, which may be circular in shape, has a projecting pin 216 which may be received by an arm 156 of a susceptor support shaft 107. The pin 216 allows the carrier rod 210 to be connected to the arm 156. The carrier rod 210 includes two support fingers 212 between first and second ends, with each end having a flat substrate support surface 217 which can support a substrate 120. The substrate sUP7rt surface 217 may be flame polished to prevent particulate generation. A vertical surface 214 near the substrate support surface 217 forms a pocket for the substrate 120. A boss 213 or other projection at the first end of the carrier rod 210 may be received by a recess or slot 218 in the top susceptor 117. In one embodiment, the carrier rod 210 may be made of quartz. In other embodiments, other materials may be used for the carrier rod. Additionally, in other embodiments of the invention, the carrier rod 210 may have three or more fingers and may be adapted to support three or more susceptors (including top and bottom susceptors 117,118) and three or more substrates. In yet another embodiment, the carrier rod 210 may have a single finger to support a single substrate 120 between top and bottom susceptors 117,118.

Figure 2B:
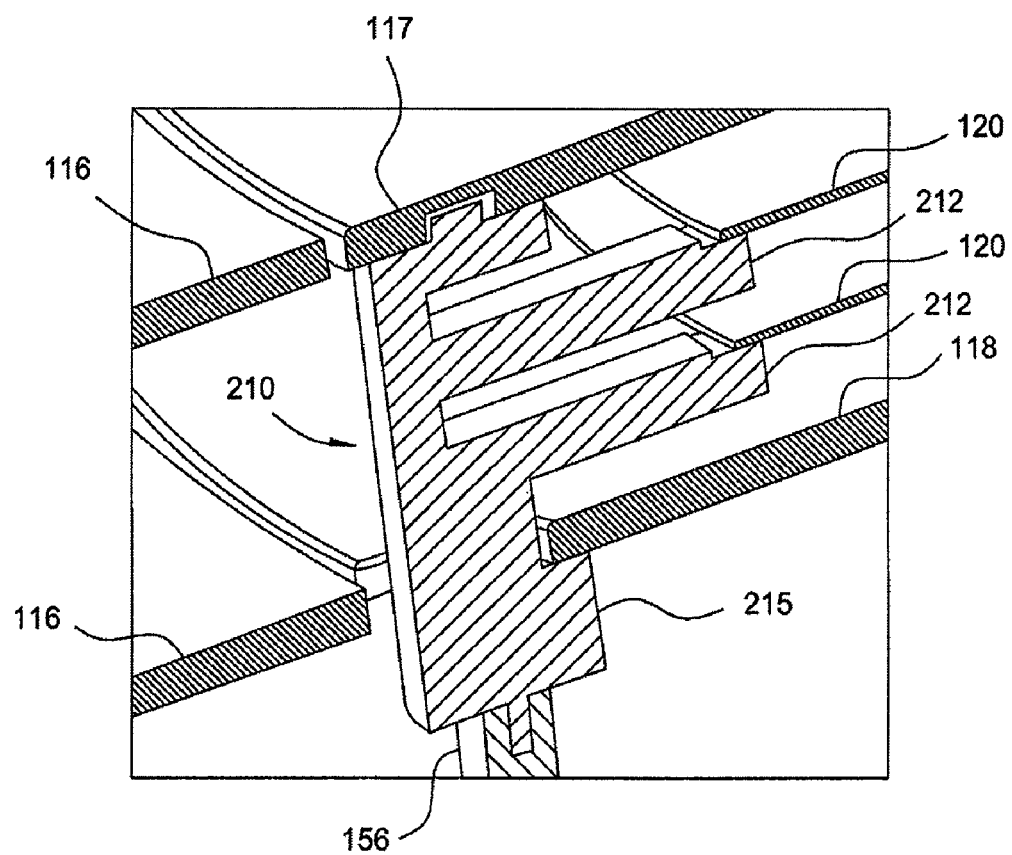
FIG. 2B is an isometric sectional view of the embodiment of the carrier rod shown in FIG. 2A, according to the present invention.

FIG. 2B is an isometric sectional view of the carrier rod 210 shown in FIG. 2A. In this view, the relative locations and shapes of the carrier rod 210, preheat rings 116, and top and bottom susceptors 117, 118 are shown. In the present embodiment, the base 215 of the carrier rod 210 is cylindrical, but may have other shapes in other embodiments.

Figure 2C:
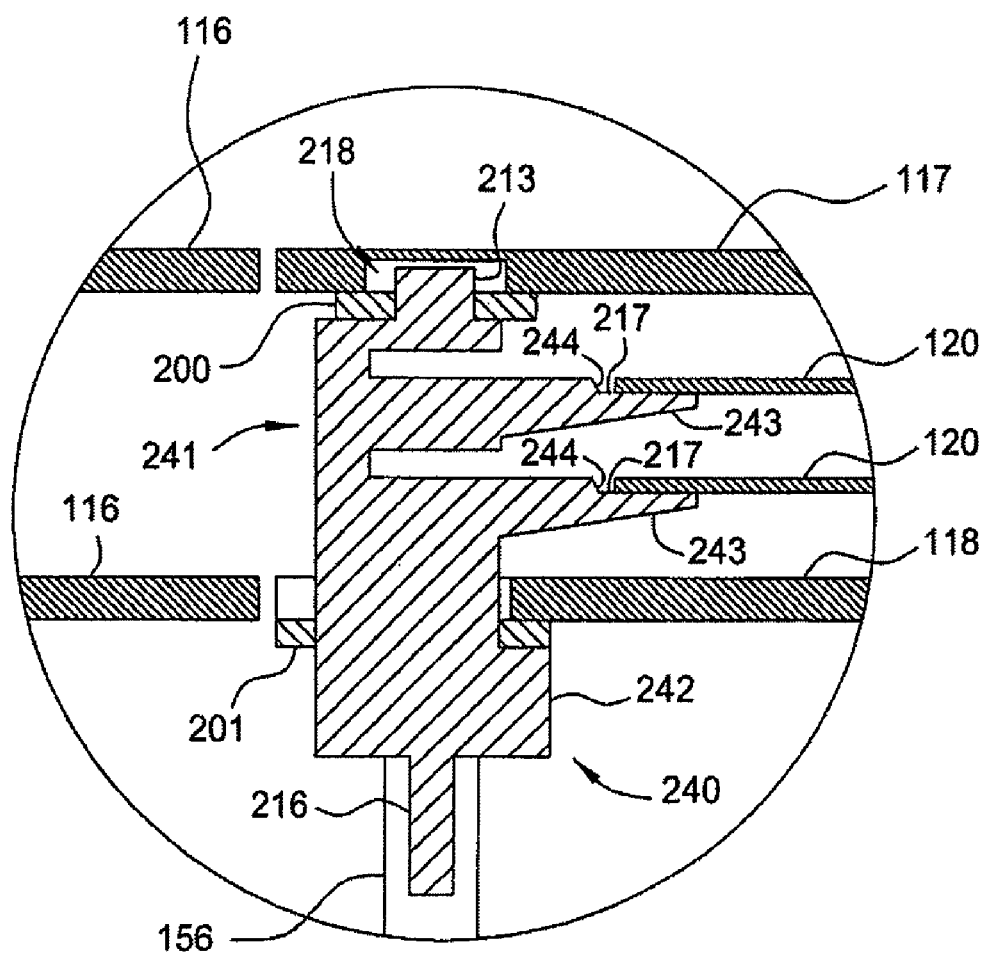
FIG. 2C is a detail view of another embodiment of a carrier rod shown in FIG. 1, according to the present invention.
Figure 2D:
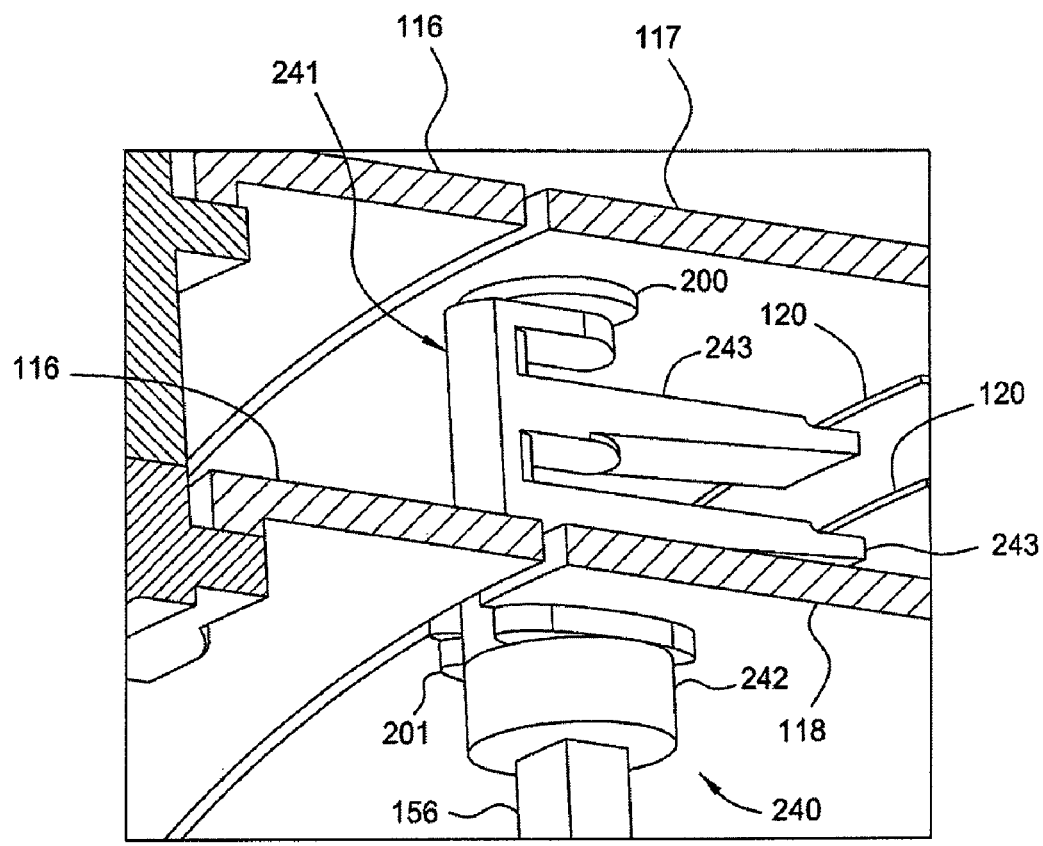
FIG. 2D is an isometric view of the embodiment of the carrier rod shown in FIG. 2C, according to the present invention.

FIG. 2C is a detail view of another embodiment of a carrier rod shown in FIG. 1, according to the present invention. In this embodiment, the carrier rod 210 may be replaced with a carrier rod assembly 240. In one embodiment of the present invention, the carrier rod assembly 240 includes a carrier rod 241, a top washer 200, and a bottom washer 201. The carrier rod 241 includes a rod with a first end and a second end, with a boss 213 at the first end, and a base 242 at the second end. The base 242, which may be circular in shape, has a projecting pin 216 which may be received by an arm 156 of a susceptor support shaft 107. The pin 216 allows the carrier rod 241 to be connected to the arm 156. The carrier rod 241 includes two support fingers 243 between first and second ends, with each finger having a tapered end, and each tapered end having a flat substrate support surface 217 which can support a substrate 120. The substrate support surface 217 may be flame polished to prevent particulate generation. An inclined surface 244 near the substrate support surface 217 forms a pocket for the substrate 120, and the inclined surface 244 may be angled at about 60 degrees with respect to a horizontal surface that is coplanar with substrate support surface 217. In other embodiments, different angles may be used for the inclined surface 244. A boss 213 or other projection at the first end of the carrier rod 241 may be received by a recess or slot 218 in the top susceptor 117. The top washer 200 is placed over the boss 213, and the top 12 susceptor rests on the top washer 200. A bottom washer 201 rests on the base 242 of the carrier rod 241 and supports the bottom susceptor 118. In one embodiment, the carrier rod 241 may be made of quartz, and the top and bottom washers 200, 201 may be made of silicon carbide (SiC). In other embodiments, other materials may be used for the carrier rod and washers. Additionally, in other embodiments of the invention, the carrier rod 241 may have three or more fingers and may be adapted to support three or more susceptors (including top and bottom susceptors 117,118) and three or more substrates. In yet another embodiment, the carrier rod 241 may have a single finger to support a single substrate 120 between top and bottom susceptors 117,118.

FIG. 2O is an isometric view of the carrier rod assembly 240 shown in FIG. 2C. In the present embodiment, the top washer 200 is a closed annular ring, and the bottom washer 201 has a rectangular outer perimeter and an open-ended slot. In other embodiments, the top and bottom washers 200, 201 may have other shapes. In the present embodiment, the base 242 of the carrier rod 241 is cylindrical, but may have other shapes in other embodiments.

Figure 3B:
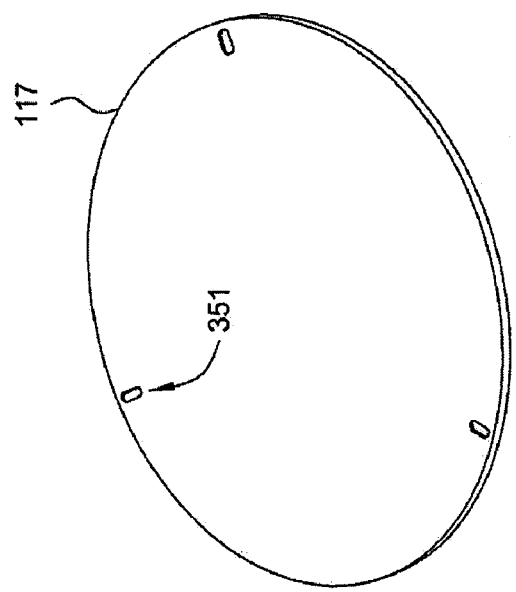
FIG. 3B is an isometric view illustrating one embodiment of a top susceptor according to the present invention
Figure 3A:
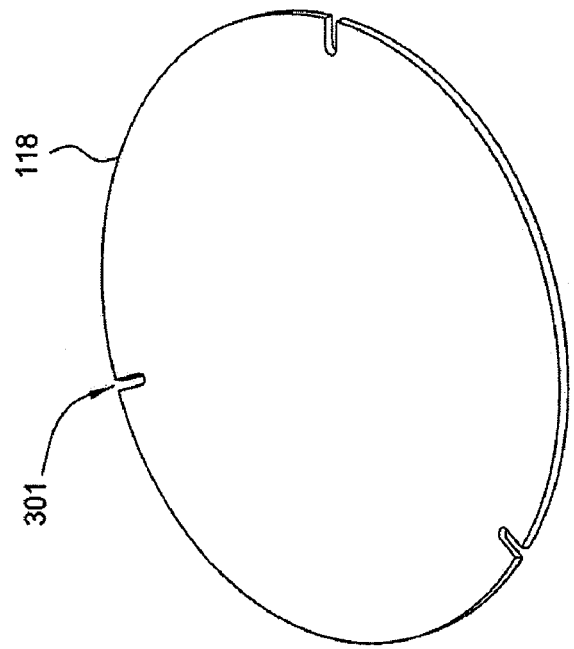
FIG. 3A is an isometric view illustrating one embodiment of a bottom susceptor according to the present invention.

FIG. 3A depicts one embodiment of the bottom susceptor 118 according to the present invention. The bottom susceptor 118 is a disk with three open-ended slots 301 located at about 120 degrees apart. FIG. 3B depicts one embodiment of the top susceptor 117 according to the present invention The top susceptor 117 is a disk with three blind slots 351 located about 1200 apart. In one embodiment, blind slot 351 may be the same as slot 218. In other embodiments, the slots of both susceptors may be closed or thru, and may have other shapes. In the present embodiment, both top and bottom susceptors 117, 118 may be made of graphite and coated with silicon carbide (SiC). In another embodiment, the susceptors may be made of high purity, sintered SiC. In yet other embodiments, different materials (e.g., ceramics) may be used for the susceptors. In one embodiment of the present invention, the diameters of the top and bottom susceptors 117,118 may be larger than the substrate 120 diameter.

Figure 4A:
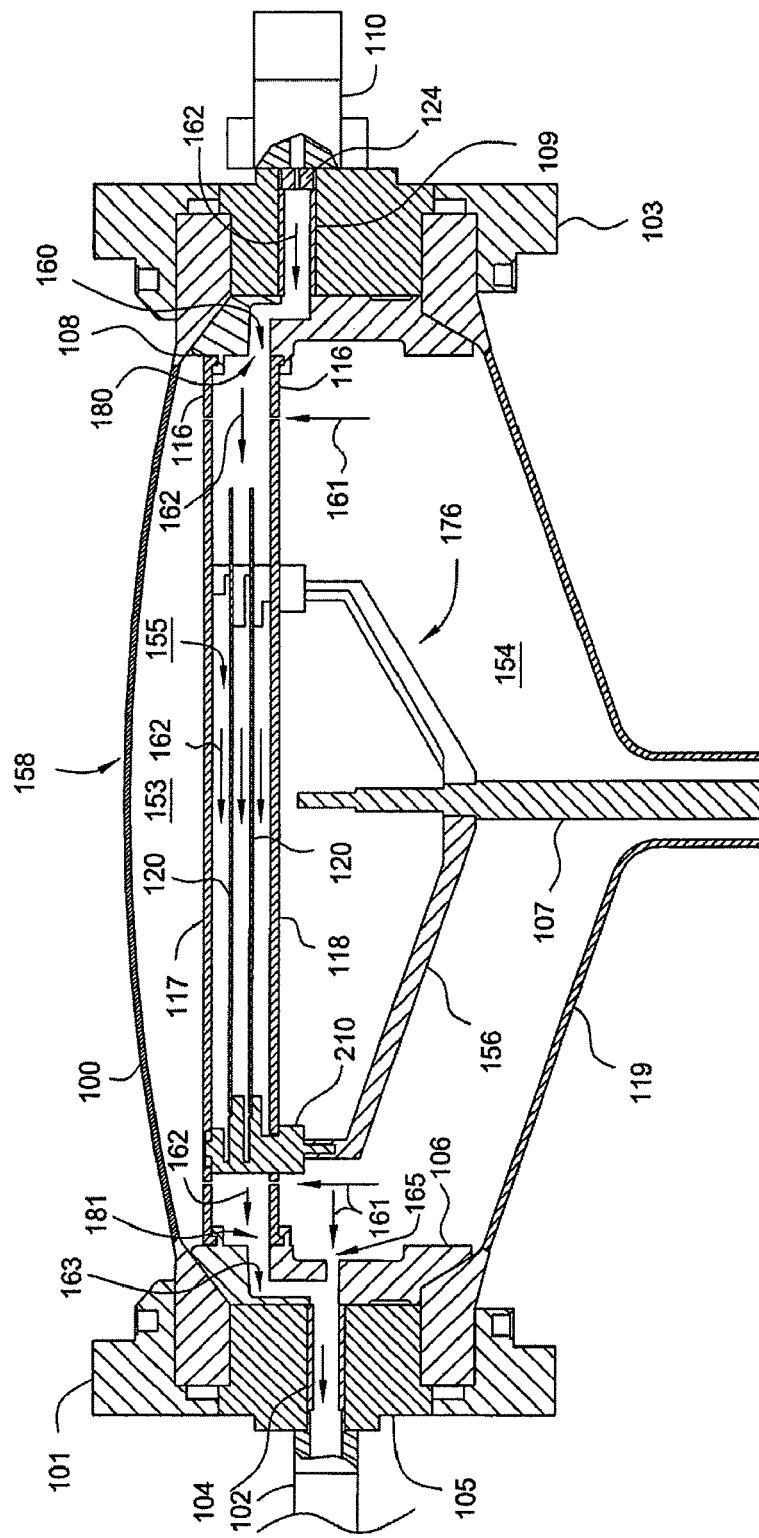
FIG. 4A is a schematic cross-sectional view illustrating one embodiment of a gas flow pattern for the chamber depicted in FIG. 1, according to the present invention.

FIG. 4A is a schematic cross-sectional view illustrating one embodiment of a gas flow pattern for the chamber depicted in FIG. 1, according to the present invention. A gas inlet manifold 110 is connected to one side of the base ring 105 and is adapted to admit gas from a source of gas or gases into the processing chamber 158. An exhaust manifold 102 is connected to the base ring 105 and positioned diagonally opposite the gas inlet manifold 110 and is adapted to exhaust gases from the processing chamber 158.

The gas inlet manifold 110 feeds process gas 162 into the processing chamber 158. The gas inlet manifold 110 includes an injection baffle 124, and an inlet port liner 109 which is inserted into the base ring 105. The inlet port liner 109 may be made of quartz to protect the stainless steel base ring 105 from corrosive process gas. The gas inlet manifold 110, injection baffle 124, and inlet port liner 109 are positioned within inlet passage 160 formed between the upper liner 108 and lower liner 106. The inlet passage 160 is connected to the middle volume 155 of the processing chamber 158. Process gas is introduced into the processing chamber 158 from the gas inlet manifold 110, then flows through the injection baffle 124, through the inlet port liner 109, and through the inlet passage 160 and then to the middle volume 155 which includes substrates 120.

Referring to FIG. 4A, note that the middle volume 155, which is formed by the preheat rings 116 and top and bottom susceptors 117 and 118, functions as a horizontal flow channel or conduit for the process gas 162. The process gas inlet port 180 and outlet port 181 are disposed between the preheat rings and top and bottom susceptors 117 and 118 when the susceptor lift assembly 176 is in the process position, as shown in FIG. 4A. As the process gas 162 enters the processing chamber 158 through process gas inlet port 180, the preheat rings 116 and top and bottom susceptors 117, 118 act to channel and direct the gas flow over the substrates 120 and to the outlet port 181. This flow geometry helps create more laminar and uniform gas flow over the substrates 120. In one embodiment of the present invention, the horizontal flow channel is created using two preheat rings and two susceptors. In other embodiments, multiple flow channels may be created using multiple preheat rings and multiple susceptors.

The processing chamber 158 also includes an independent purge gas inlet (not shown) for feeding a purge gas 161, such as hydrogen ($H_2$) or nitrogen ($N_2$), into the lower volume 154 of the chamber. In this example, the purge gas inlet is positioned on the base ring 105 at an angle of 90 degrees from the gas inlet manifold 110. In other embodiments, a purge gas inlet can be integrated into the gas inlet manifold 110 so long as a separate flow passage is provided so that the purge gas can be controlled and directed independent of the process gas.

In one embodiment, an inert purge gas or gases 161 are fed into the lower volume 154 while the process gas 162 is fed independently into the middle volume 155. Purging the chamber with the purge gas 161 prevents deposition from occurring on the lower dome 119 or on the bottom susceptor 118.

As mentioned, the processing chamber 158 also includes an exhaust manifold 102 which allows removal of process and purge gases from the chamber. The exhaust manifold 102 is connected to the base ring 105 over an exhaust passage 163 which extends from the middle volume 155 to the outer wall of the base ring 105. An exhaust port liner 104 is inserted into the base ring 105. The exhaust port liner 104 may be made of quartz to protect the stainless steel base ring 105 from corrosive process gas. A vacuum source, such as a pump (not shown) for creating low or reduced pressure in the processing chamber 158 is coupled to the exhaust passage 163 by an outlet pipe (not shown) which connects to the exhaust manifold 102. The process gas 162 is exhausted through the exhaust passage 163 and into the exhaust manifold 102.

A vent passage 165 extends from the chamber lower volume 154 to the exhaust passage 163. Purge gas 161 is exhausted from the lower volume 154 through the vent passage 165, through the exhaust passage 163, and into an outlet pipe (not shown). The vent passage 165 allows for direct exhausting of the purge gas from the lower volume 154 to the exhaust passage 163.

For uniform epitaxial film deposition, the reactor chamber 150 may provide a means for distributing process gas uniformly across the substrate surfaces and a means for uniformly heating the substrate surfaces so that the deposition reactions will occur uniformly across the substrate surfaces.

The radiant heating of the preheat rings 116 and top and bottom susceptors 117 and 118 also provides preheating of the process gas before it reaches the substrates. Referring to FIG. 4A, the process gas 162 enters the processing chamber 158 through process gas inlet port 180, and then passes over the bottom preheat ring 116, and then passes over the bottom susceptor 118 before reaching the substrates 120. Since the substrate diameters are smaller than the diameters of the susceptors, the process gas is heated by the susceptors before reaching the substrates. This helps improve the temperature uniformity of the process gas across the substrate surfaces.

Figure 4B:
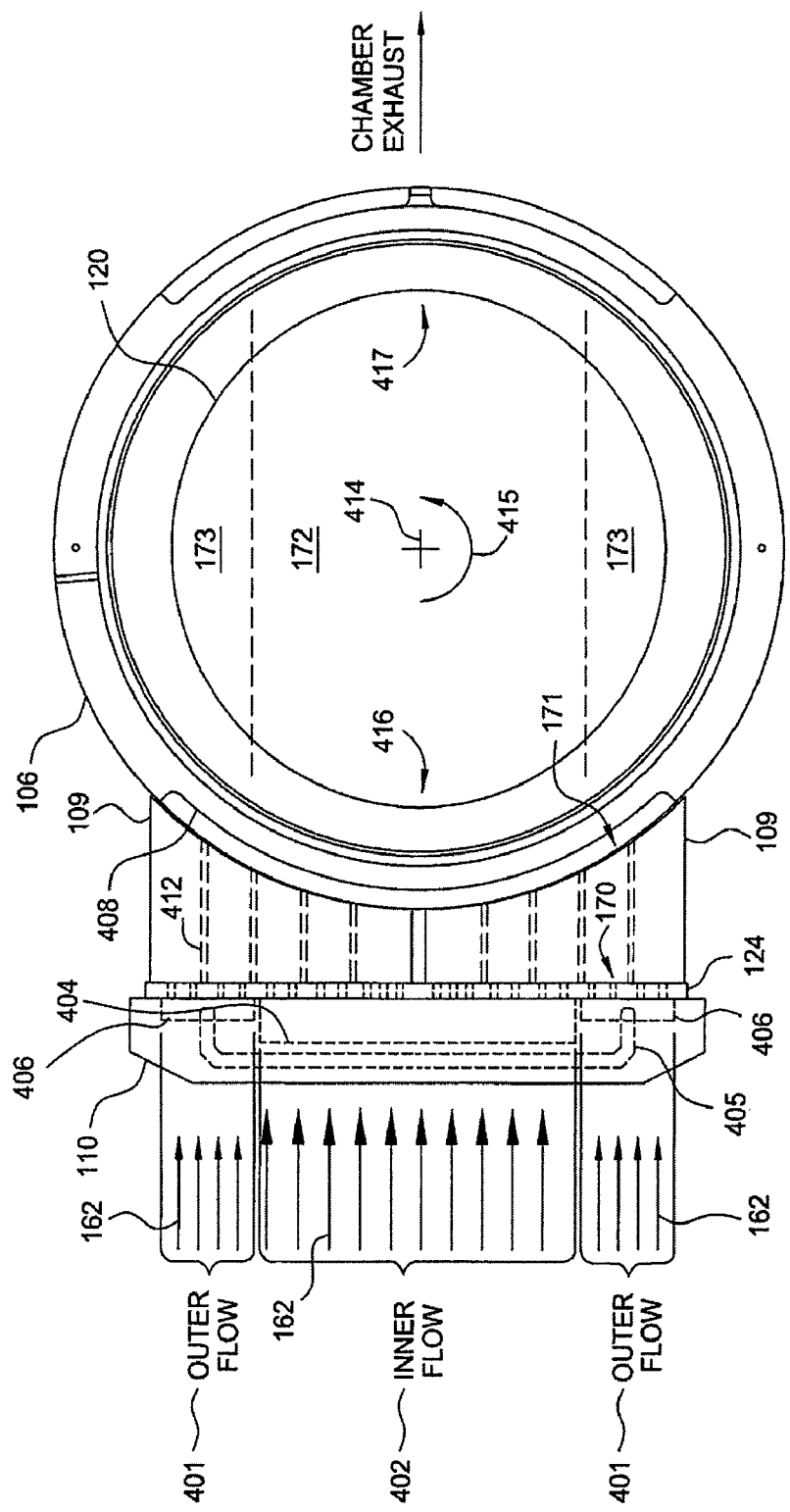
FIG. 4B is a schematic top view illustrating one embodiment of a gas flow pattern for the chamber depicted in FIG. 1, according to the present invention.

FIG. 4B is a schematic top view illustrating one embodiment of a dual zone gas flow pattern for the processing chamber 158 depicted in FIG. 1. To clarify the discussion, all processing chamber 158 components have been removed from view except the gas inlet manifold 110, injection baffle 124, inlet port liners 109, lower liner 106, and substrate 120. The substrate 120 represents the top substrate, but the same discussion applies to the bottom substrate. Two inlet port liners 109 are disposed between the lower liner inlet port 408 and injection baffle 124 which includes multiple thru holes 170. Each inlet port liner 109 includes baffles 412 which create multiple gas inlet ports 171 which lead to the process gas inlet port 180 shown in FIG. 4A. A gas inlet manifold 110 includes two outer plenums 406 and an inner plenum 404. The two outer plenums 406 are connected by a passage 405. Separate gas lines (not shown) are connected to the gas inlet manifold 110 so that process gas 162 (arrows) can be directed to the inner and outer plenums 404 and 406 and the gas flow rates can be independently controlled for each plenum. The inner and outer plenums 404, 406 create two flow zones, a central or inner flow zone 402 and two outer flow zones 401. The two inlet port liners 109 further divide the inner flow zone 402 into two inner flow fields. The gas flow rates may be reduced for the outer flow zones 401 since a smaller portion of substrate surface area is exposed to the process gas 162. For example, the total gas flow rate for the inner flow zone 402 may be twice as large as the total flow rate for the outer zones 401. The reduction in flow rate for the outer flow zones 401 helps prevent more reactant material from being deposited at the smaller outer areas 173 of the substrate surface compared to the larger inner area 172, and, therefore, improves the uniformity of deposition across the substrate. The dotted lines in FIG. 48 roughly indicate where the flow rates differ over the substrate surface. In another embodiment of the present invention, multiple plenums may be used to create multiple gas flow zones which are used with multiple gas inlet ports 171.

Since the process gas 162 flows across the substrate 120 from a leading edge 416 to a trailing edge 417, there is tendency for process gas concentration to decrease as reactant material flows across the substrate surface and is deposited from leading edge 416 to trailing edge 417. This may result in more material being deposited at the substrate leading edge than at the trailing edge. To avoid this result, the substrate is may be rotated about an axis 414 in a predetermined direction 415 so that the distribution of reactant material in the process gas is evened out over the substrate surface and the reactant deposition is more uniform across the substrate 120 surface.

Although previously cited aspects of the present invention may help improve uniformity of deposition, another aspect improves substrate throughput by processing two substrates simultaneously. Multiple substrate processing requires multiple substrate loading and unloading from the processing chamber, and this can also affect substrate throughput. Other aspects of the invention include methods for loading and unloading multiple substrates from the processing chamber.

Figure 5A:
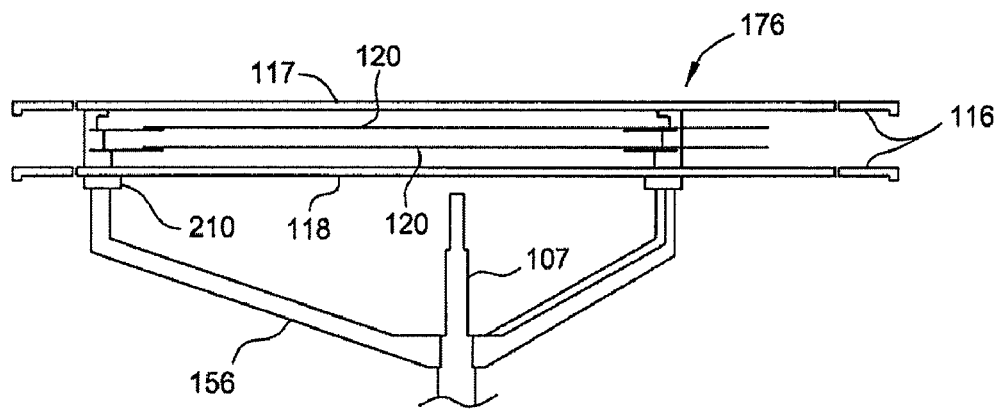
FIG. 5A is a cross-sectional view illustrating one embodiment of process position for the chamber depicted in FIG. 1, according to the present invention.
Figure 5B:
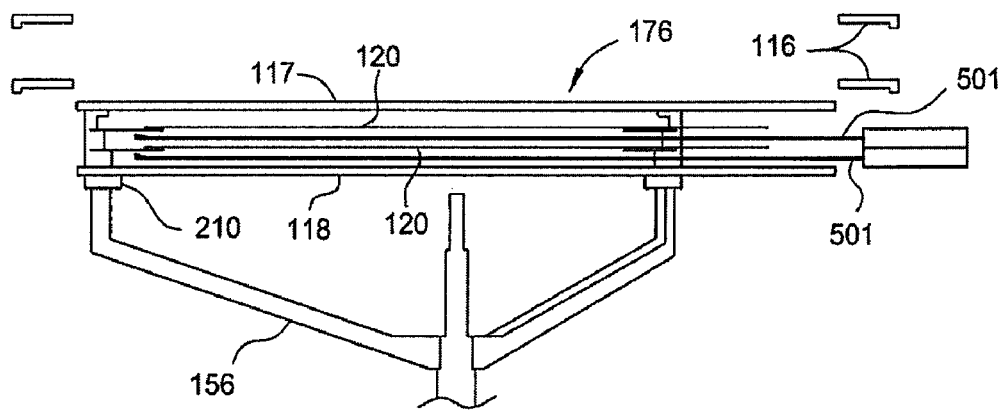
FIG. 5B is a cross-sectional view illustrating one embodiment of home position for the chamber depicted in FIG. 1 for a dual bladed robot, according to the present invention.
Figure 5C:
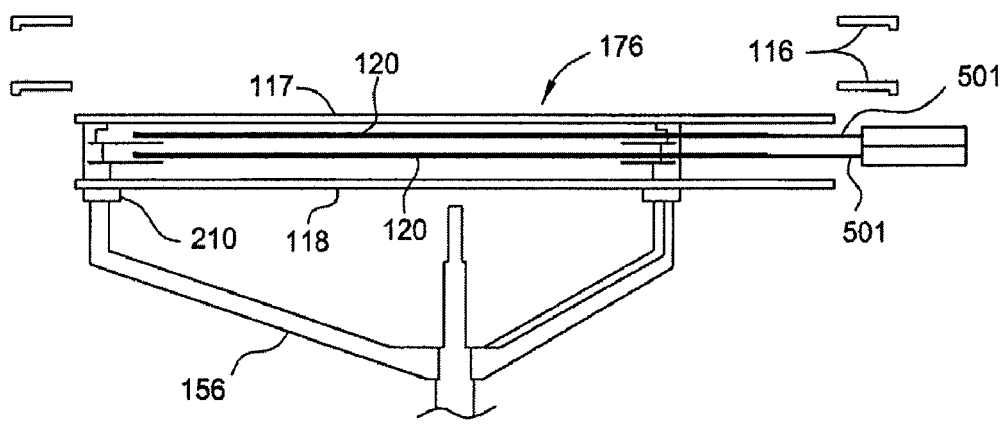
FIG. 5C is a cross-sectional view illustrating one embodiment of exchange position for the chamber depicted in FIG. 1 for a dual bladed robot, according to the present invention.

In some embodiments, a dual-blade robot may be provided to facilitate substrate loading and unloading in a reactor chamber having dual susceptors, such as, for example, the epitaxial deposition reactor chamber 150 discussed above with respect to FIG. 1. For example, FIGS. 5A-5C depict schematic side views of a susceptor lift assembly 176 at different locations for substrate unloading using a dual bladed robot. The susceptor lift assembly 176 includes top and bottom susceptors 117 and 118, carrier rods 210, and susceptor support shaft 107 and arms 156. In FIG. 5A, the susceptor lift assembly 176 is in process position, and the top and bottom susceptors 117 and 118 are coplanar with preheat rings 116. When substrate processing is completed, the susceptor lift assembly 176 then moves down to a home position, and two robot blades 501 of a dual bladed robot (not shown) enter the process chamber as shown in FIG. 5B. Once the blades have been extended to the position shown in FIG. 5B, the lift assembly 176 moves further down and the substrates 120 are lifted from the support fingers 212 by the robot blades 501 so that the substrates rest on the robot blades 501. The susceptor lift assembly 176 stops at a low point of downward travel, shown in 5C, and this is called the exchange position. The robot blades 501 then retract to remove the substrates from the process chamber. Substrate loading is achieved by reversing the unloading sequence. An advantage of using a dual bladed robot is that two substrates can be unloaded or loaded simultaneously from the process chamber, which helps improve chamber throughput. In this embodiment, the robot blades maintain a fixed vertical position relative to the processing chamber, and all load and unload positions are enabled by the motion of the susceptor lift assembly 176. In other embodiments, the robot may have vertical motion capability (z-capability) so that the blades can move in the vertical direction to facilitate substrate loading and unloading. In one embodiment, the susceptors remain at or near substrate processing temperatures during loading and unloading to shorten process cycle time.

Figure 8:
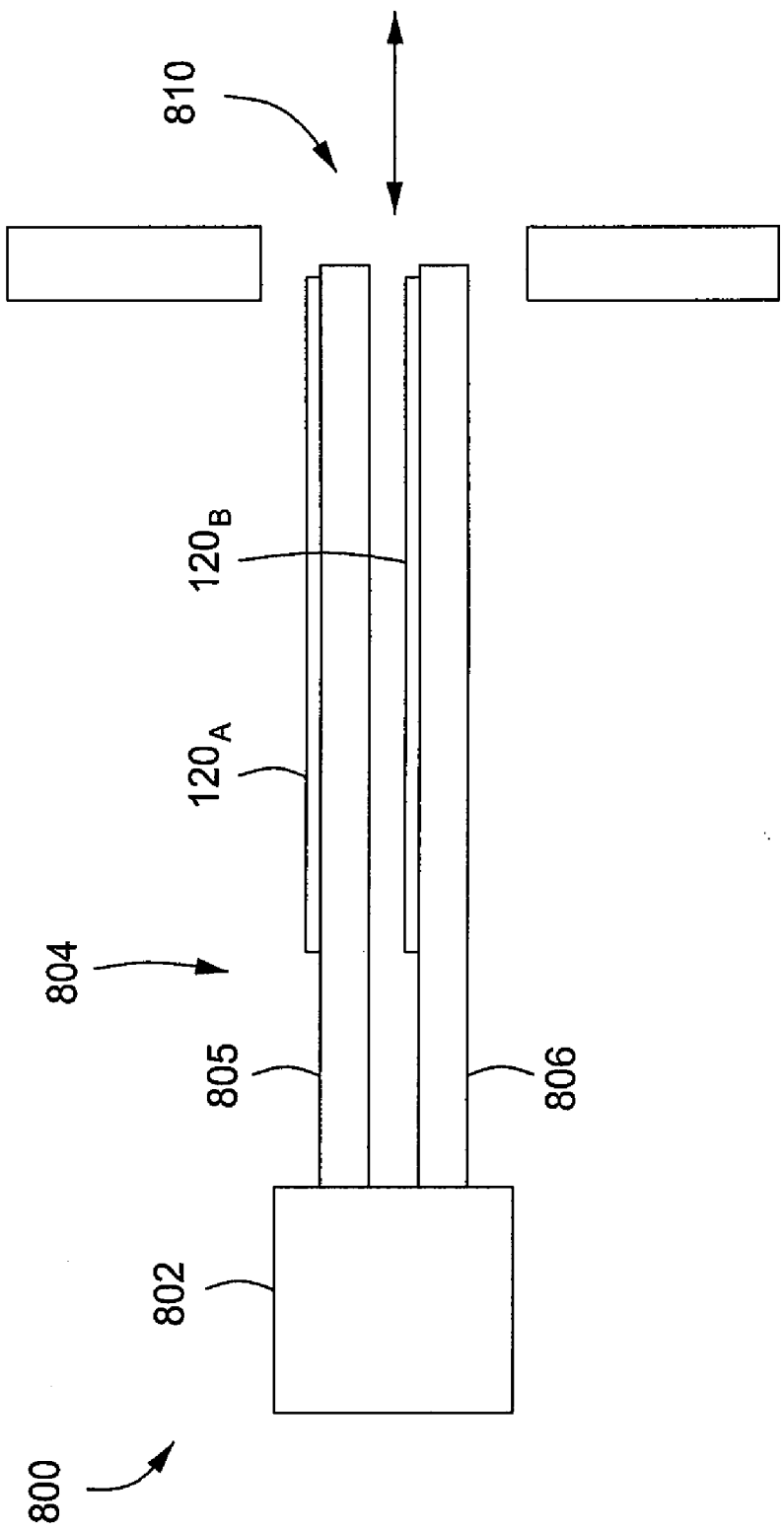
FIG. 8 is a schematic side view of a multi-substrate transfer robot in accordance with some embodiments of the present invention.

FIG. 8 depicts a schematic side view of a multi-substrate transfer robot 800 in accordance with some embodiments of the present invention that is suitable for use in connection with a reactor chamber having vertically disposed multiple-substrate susceptors, such as the epitaxial deposition reactor chamber 150 discussed above with respect to FIG. 1. The multi-substrate transfer robot 800 includes a wrist 802 having a plurality of blades 804 vertically disposed thereon. Each blade 804 is capable of holding, delivering, or receiving a semiconductor substrate from a process chamber. The plurality of blades 804 are configured to pass through an opening in the process chamber (such as a slit valve opening or the like). As shown in FIG. 8, two substrates $120_A$ and $120_B$ may be provided for use with a dual-substrate susceptor, such as that discussed above with respect to the epitaxial deposition reactor chamber 150 of FIG. 1. In some embodiments, such as illustrated in FIG. 8, the plurality of blades 804 may be two blades, such as an top blade 805 and a bottom blade 806. The blades 805, 806 are sufficiently vertically displaced with respect to each other to allow the lower substrate $120_B$ to be placed upon or removed from the bottom blade 806 without interference with the top blade 805 (or any substrate $120_A$ disposed thereon).

The wrist 802 may support each blade 804 in a fixed position relative to each other such that control over the movement of the wrist 802 may facilitate control over the position of each of the plurality of blades 804. The wrist 802 may be coupled to an arm 914 (shown in FIG. 9) capable of moving the wrist 802 (and the plurality of blades 804) in a horizontal direction, such as to extend horizontally through an opening 810 in a process chamber to deliver or receive substrates to the process chamber. In some embodiments, the wrist 802 may be capable of at least one of horizontal or vertical rotational motion with respect to the arm, such as, for example, by being coupled to the arm via a hinge, a pin, a pivotable joint, a flexure, or the like. In some embodiments, the arm may be coupled to an assembly 916 (shown in FIG. 9) for providing vertical and/or rotational movement of the arm about a central axis. Such vertical and/or rotational movement of the arm facilitates moving the wrist 802 (and the plurality of blades 804) vertically and/or rotationally as needed to deliver or receive substrates as desired.

The components of the multi-substrate transfer robot (e.g., the arm, the wrist, the blades, or the like) may be fabricated from any process suitable materials. For example, in some embodiments, materials may be selected to minimize deflection of the robot blades during the substrate transfer. In some embodiments, materials may be selected to minimize contamination of the substrate by the robot blades during the substrate transfer. In some embodiments where transfers are being made to or from a chamber at a high temperature, materials may be selected to minimize thermal effects during the substrate transfer. Examples of suitable materials include, but are not limited to, ceramics, metals, quartz, glass ceramics (such as Neoceram N-0 and Neoceram N-11, among others), aluminum/silicon carbide composites, aluminum/iron composites, carbon, carbon matrix composites, cast aluminum alloy, commercially pure chromium, graphite, molybdenum, titanium alloy, molybdenum tungsten alloy, commercially pure molybdenum, Zerodur®, Invar®, titanium Ti-6Al-4V alloy, 8090 aluminum MMC, and metal matrix composites. Metal matrix composites generally include aluminum or other light metal (i.e., magnesium, titanium, aluminum, magnesium alloys, titanium alloys and aluminum alloys) with up to 30 percent fillers, such as silicon carbide and the like. In embodiments, where the substrate transfer robot is transferring substrates to or from an epitaxial deposition chamber, such as the epitaxial deposition reactor chamber 150 of FIG. 1, the blades may be made of quartz.

In operation, and referring to FIGS. 8 and 5B-C, when substrate processing is completed, the susceptor lift assembly 176 moves down to a home position, the plurality of blades 804 of the multi-substrate transfer robot 800 enters the process chamber with each blade 804 disposed below each substrate $120_{A-B}$ to be retrieved. The top blade 805 may be positioned under the upper substrate $120_A$, and the bottom blade 806 may be simultaneously positioned under the bottom substrate $120_B$. Once the blades 805, 806 have been extended to a position beneath the substrates $120_{A-B}$, as shown in FIG. 5B, the susceptor lift assembly 176 moves further down and each substrate 120 is placed onto each blade 805, 806. The susceptor lift assembly 176 continues its downward motion and then stops at a first exchange position, similar to the exchange position shown in FIG. 5C. At this point, there is sufficient clearance so that the blades 805, 806 can retract and remove each substrate $120_{A-B}$ simultaneously from the process chamber without touching the susceptor lift assembly 176. The blades 805, 806 then retract to remove the substrates $120_{A-B}$ from the process chamber. Substrate loading may be achieved by reversing the unloading sequence.

As discussed above, the multi-substrate transfer robot 800 may be part of a substrate processing system having at least one process chamber with a plurality of susceptors vertically disposed therein. Suitable chambers include, for example, those described hereinabove, such as the epitaxial deposition reactor chamber 150 of FIG. 1. In some embodiments, the multi-substrate transfer robot 800 may be disposed within a cluster tool, such as, for example, one of the CENTURA® or ENDURA® line of cluster tools available from Applied Materials, Inc. of Santa Clara, Calif. The multi-substrate transfer robot 800 may also be utilized in other suitable cluster tools as well.

Figure 9:
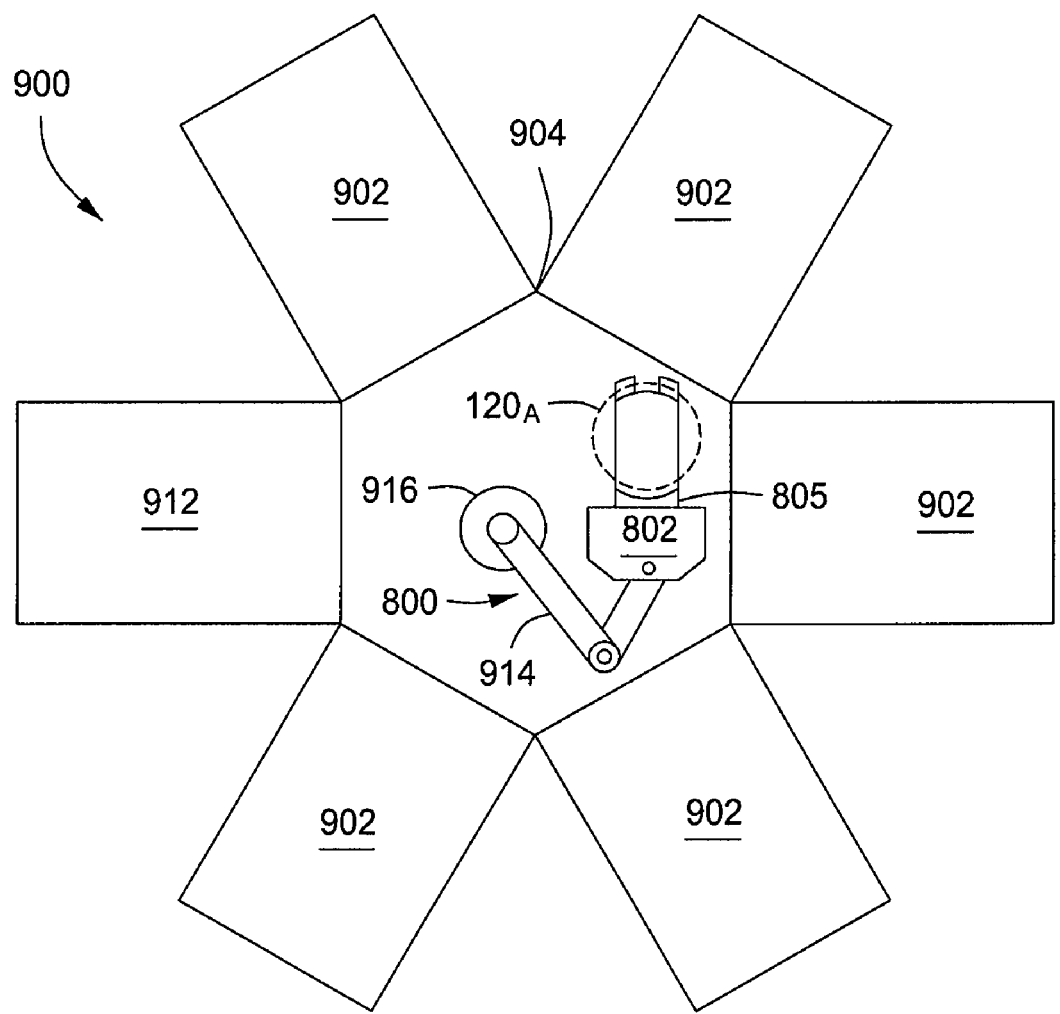
FIG. 9 is schematic top view of a cluster tool in accordance with some embodiments of the present invention.

FIG. 9 depicts a simplified schematic diagram of an exemplary cluster tool 900 having the multi-substrate transfer robot 800 disposed therein. The cluster tool 900 generally includes a central transfer chamber 904, a plurality of process chambers 902, and at least one load lock chamber 912. Process chambers 902 are generally configured to perform one or more steps of a production process. For example, one process chamber 902 may be the epitaxial deposition reactor chamber 150, or any other process chamber as is conventionally known in the art, and having multiple vertically disposed susceptors to interface with the plurality of blades 804 of the multi-substrate transfer robot 800.

The cluster tool depicted in FIG. 9 is illustrative only and other cluster tools having other configurations may suitable be modified to utilize the multi-substrate transfer robot of the present invention. For example, cluster tools may be provided having central transfer chambers that have different geometries, such as square or other shapes, or that support different numbers of process chambers and/or load locks. In addition, some cluster tools may be provided having multiple central transfer chambers coupled to each other as well as other process chambers and load lock chambers (such as the ENDURA® cluster tool referred to above).

Referring back to the illustrative cluster tool 900 of FIG. 9, the central transfer chamber 904 generally includes the multi-substrate transfer robot 800 adapted to transfer a plurality of substrates in and out of the load lock chamber 912 and the various process chambers 902 (uppermost substrate $120_A$ shown in phantom in FIG. 9). As discussed above with respect to FIG. 8, the multi-substrate transfer robot 800 generally has a plurality of vertically disposed blades extending from the wrist 802 (top blade 805 shown in FIG. 9). The plurality of blades are adapted to support a plurality of substrates thereon during transfer by the multi-substrate transfer robot 800. The wrist 802 may be coupled to an arm 914 capable of movement in a horizontal direction, such as to extend horizontally through an opening in the process chamber 902 and/or the load lock 912 to deliver or receive substrates to the process chamber 902 or the load lock 912. In some embodiments, the arm may be coupled to an assembly 916 for providing motion vertically and/or rotationally about a central axis and for interfacing with one or more of the process chambers 902 and/or load lock 912. The cluster tool 900 is merely one embodiment of a processing system wherein the multi-substrate transfer robot 800 may be utilized. It is contemplated that the multi-substrate transfer robot 800 may be disposed in any suitable cluster tool, and/or multi-substrate processing apparatus requiring the exchange and/or high throughput of semiconductor wafers in a vertically stacked fashion.

Figure 6A:
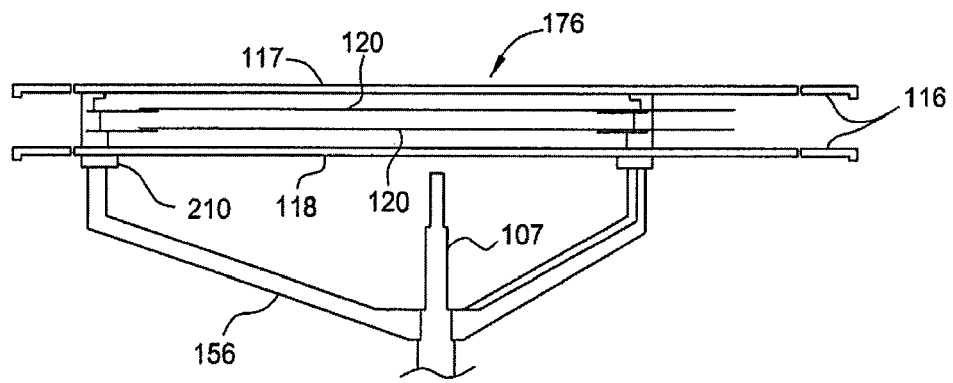
FIG. 6A is a cross-sectional view illustrating one embodiment of process position for the chamber depicted in FIG. 1, according to the present invention.
Figure 6B:
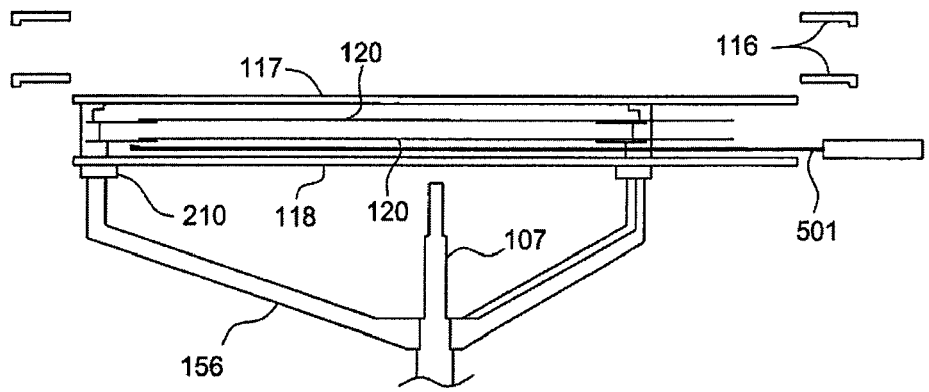
FIG. 6B is a cross-sectional view illustrating one embodiment of first home position for the chamber depicted in FIG. 1 for a single blade robot, according to the present invention.
Figure 6C:
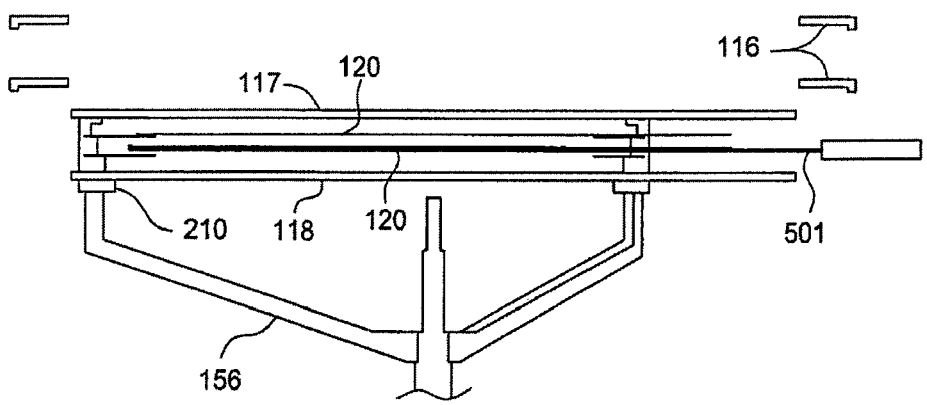
FIG. 6C is a cross-sectional view illustrating one embodiment of first exchange position for the chamber depicted in FIG. 1 for a single blade robot, according to the present invention.
Figure 6D:
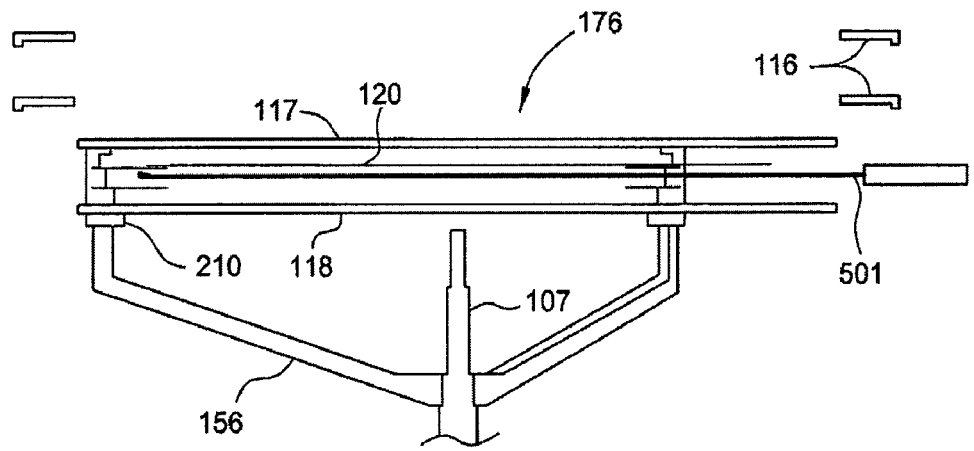
FIG. 6D is a cross-sectional view illustrating one embodiment of second home position for the chamber depicted in FIG. 1 for a single blade robot, according to the present invention.
Figure 6E:
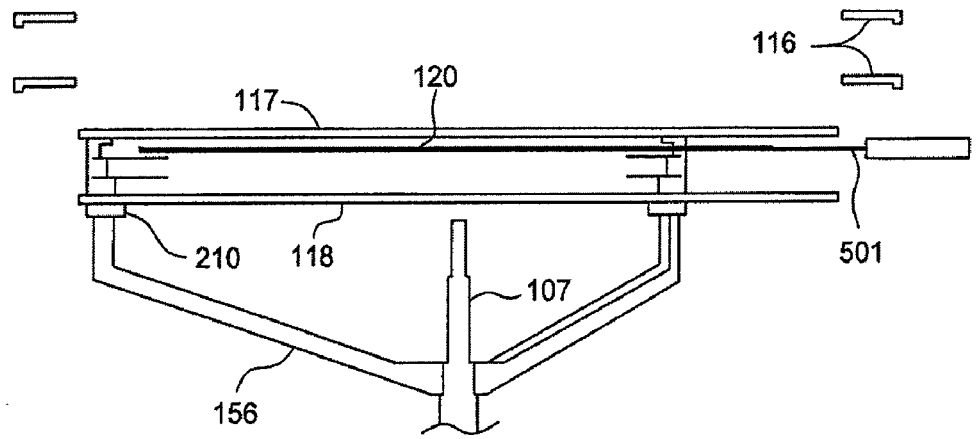
FIG. 6E is a cross-sectional view illustrating one embodiment of second exchange position for the chamber depicted in FIG. 1 for a single blade robot, according to the present invention.

Although embodiments of multi-substrate transfer robots have been disclosed herein, the transfer of multiple substrates may also be accomplished utilizing single substrate transfer robots. For example, FIGS. 6A-6E show schematic side views of a susceptor lift assembly 176 at different locations for substrate unloading using a single bladed robot. In FIG. 6A, the susceptor lift assembly 176 is in process position, and the top and bottom susceptors 117 and 118 are coplanar with preheat rings 116. When substrate processing is completed, the susceptor lift assembly 176 moves down to a first home position, and a robot blade 501 of a single bladed robot (not shown) enters the process chamber as shown in FIG. 6B. In this embodiment, the blade is positioned under the bottom substrate in the first home position. Once the blade has been extended to the position shown in FIG. 6B, the susceptor lift assembly 176 moves further down and the substrate 120 on bottom is placed onto the robot blade 501. The susceptor lift assembly 176 continues its downward motion and then stops at a first exchange position, as shown in 6C. At this point, there is sufficient clearance so that the robot blade 501 can retract and remove the substrate 120 on bottom from the process chamber without touching the top substrate or susceptor lift assembly 176. The robot blade 501 then retracts to remove the bottom substrate from the process chamber. The susceptor lift assembly 176 moves further down to a second home position, and the robot blade 501 enters the chamber. FIG. 6D shows the blade location relative to the top substrate. The susceptor lift assembly 176 then moves down again, and the substrate 120 on top is placed onto the robot blade 501. The susceptor lift assembly 176 continues its downward motion and then stops at a second exchange position, as shown in 6E. The robot blade 501 then retracts to remove the substrate 120 from the process chamber. As in the case of dual blade unloading, substrate loading may be achieved by reversing the unloading sequence. In this embodiment, the single robot blade maintains a fixed vertical position relative to the processing chamber, and all load and unload positions are enabled by the motion of the susceptor lift assembly 176. In other embodiments, the robot may have z-capability so that the blades can move in the vertical direction to facilitate substrate loading and unloading. Additionally, other embodiments may include loading and unloading of three or more substrates, and the first home position may not be restricted to the bottom substrate.

Figure 7A:
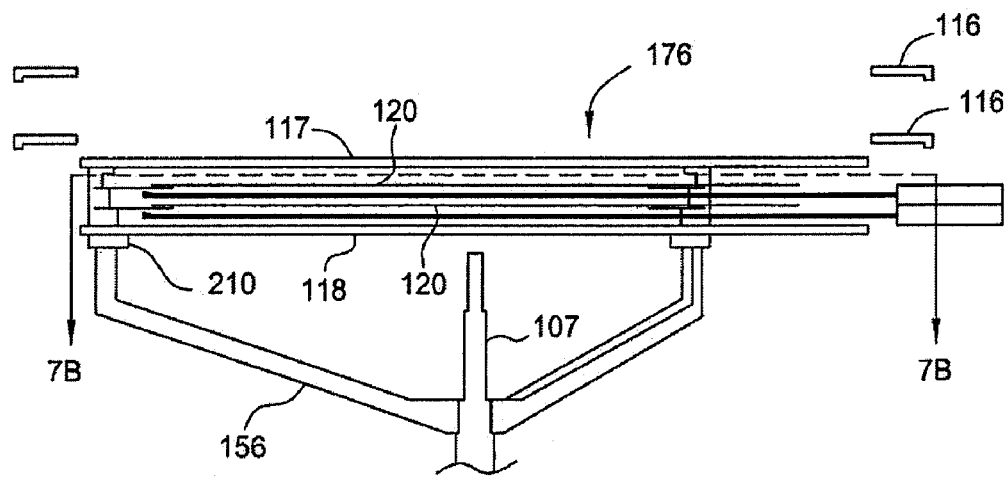
FIG. 7A is one embodiment of a schematic cross-sectional view of a susceptor lift assembly during substrate loading or unloading, according to the present invention.
Figure 7B:
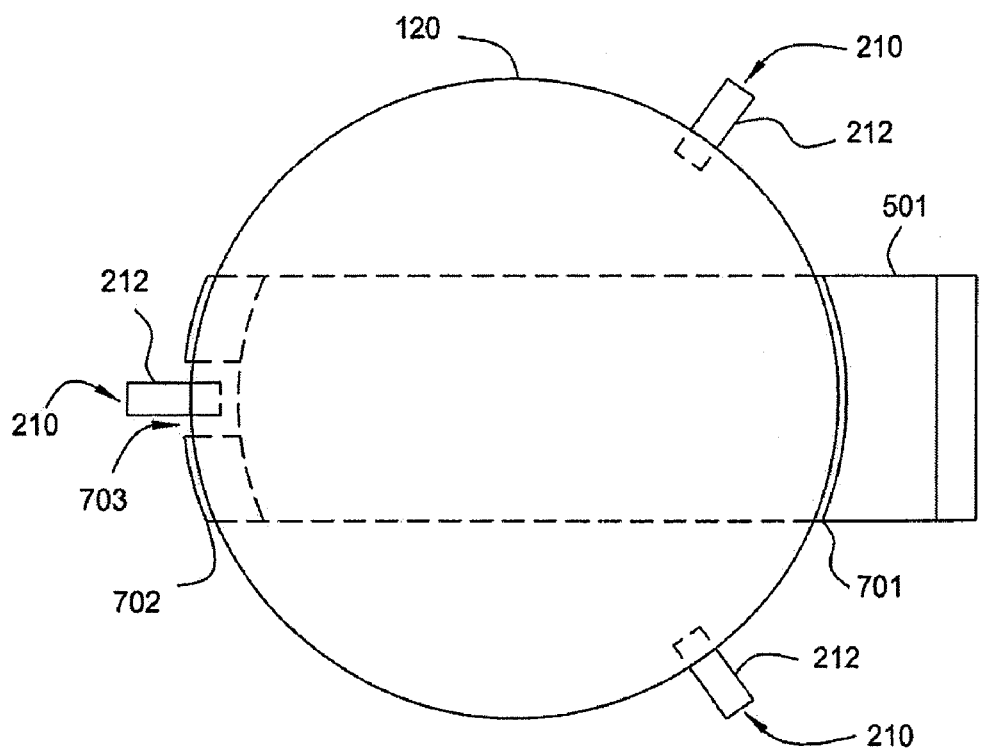
FIG. 7B is one embodiment of a schematic top view of the susceptor lift assembly shown in FIG. 7 A, with the bottom susceptor removed from view, during substrate loading or unloading, according to the present invention.

FIG. 7B is a schematic top view of a susceptor lift assembly 176 shown in FIG. 7 A, with the bottom susceptor 118 removed from view, during substrate loading or unloading.

The substrate 120 is above the robot blade 501, and the blade has an opening 703 at one end so that the blade will not interfere with the support fingers 212 of the carrier rods 210. The robot blade 501 has a front raised portion 702 and rear raised portion 701 that form a pocket for the substrate.

While the foregoing is directed to certain embodiments of the present invention, other and further embodiments of the invention may be devised without departing from the basic scope thereof, and the scope thereof is determined by the claims that follow.

The invention claimed is:

1. A substrate processing system, comprising:
a substrate processing chamber having a susceptor lift assembly having three or more carrier rods disposed in the chamber, the carrier rods configured to support a top susceptor, a bottom susceptor, and a plurality of semiconductor wafers between the top susceptor and the bottom susceptor; and
a substrate transfer robot having a plurality of blades consisting of two blades for transferring a plurality of substrates to and from the processing chamber, each blade configured to horizontally support a semiconductor wafer on the blade and vertically aligned with respect to the other blade such that the plurality of blades have central vertical axes that are substantially coincident, wherein the substrate transfer robot has a range of motion sufficient to move the plurality of blades into the substrate processing chamber and above the plurality of substrate supports.

2. The substrate processing system of claim 1, the substrate transfer robot further comprising:
an arm capable of extending along a horizontal direction;
an assembly having the arm coupled to the assembly, the assembly capable of vertical linear movement and horizontal rotational movement; and
a wrist coupled to the arm and having a plurality of blades coupled to the wrist, wherein each blade is configured to support a semiconductor wafer horizontally on the blade and is vertically aligned with respect to each of the other blades.

3. The substrate processing system of claim 2, wherein the two blades comprise:
a top blade capable of interfacing with a top semiconductor wafer disposed within the substrate processing chamber and capable of exchanging a first semiconductor wafer therewith; and
a bottom blade capable of interfacing with a bottom semiconductor wafer disposed within the substrate processing chamber and capable of simultaneously exchanging a second semiconductor wafer therewith.

4. The substrate processing system of claim 1, further comprising:
a cluster tool comprising a central transfer chamber having the substrate processing chamber coupled to the central transfer chamber, wherein the substrate transfer robot is disposed within the central transfer chamber.

5. The substrate processing system of claim 1, wherein the plurality of blades are capable of simultaneously transferring a plurality of semiconductor wafers to or from the susceptor lift assembly.

6. A method for exchanging semiconductor wafers, comprising:
providing a processing chamber having a susceptor lift assembly having three or more carrier rods disposed in the chamber, the carrier rods configured to support a top susceptor, a bottom susceptor, and a plurality of semiconductor wafers between the top susceptor and the bottom susceptor disposed in the process chamber; and extending an arm of a substrate transfer robot into the processing chamber, the arm having a wrist with a plurality of blades consisting of two blades coupled to the wrist, wherein each blade is configured to horizontally support a semiconductor wafer on the blade and is vertically aligned with respect to the other blade such that the plurality of blades have central vertical axes that are substantially coincident and, upon extension into the processing chamber, each blade of the plurality of blades interfaces with a respective one of the plurality of semiconductor wafers.

7. The method of claim 6, further comprising:

vertically raising or lowering the arm of the substrate transfer robot to transfer the semiconductor wafer between the plurality of blades and at least one of a load lock or the susceptor lift assembly.

8. The method of claim 6, wherein the plurality of blades further comprises an top blade for interfacing with a top semiconductor wafer disposed on the susceptor lift assembly and exchanging a semiconductor wafer therewith and a bottom blade for interfacing with a bottom semiconductor wafer and exchanging a semiconductor wafer therewith.

9. The method of claim 6, wherein a plurality of semiconductor wafers are transferred from the plurality of blades to the susceptor lift assembly simultaneously.

10. The method of claim 6, wherein a plurality of semiconductor wafers are transferred from the susceptor lift assembly to the plurality of blades simultaneously.

11. The substrate processing system of claim 1, wherein the plurality of blades are the only substrate support surfaces of the substrate transfer robot.

* * * * *